US 11,984,822 B2

United States Patent
Yano et al.

(10) Patent No.: US 11,984,822 B2
(45) Date of Patent: May 14, 2024

(54) POWER CONVERSION APPARATUS

(71) Applicant: Hitachi Astemo, Ltd., Ibaraki (JP)

(72) Inventors: Tomohiko Yano, Tokyo (JP); Shinichirou Wada, Tokyo (JP)

(73) Assignee: HITACHI ASTEMO, LTD., Ibaraki (JP)

( * ) Notice: Subject to any disclaimer, the term of this patent is extended or adjusted under 35 U.S.C. 154(b) by 120 days.

(21) Appl. No.: 17/784,334

(22) PCT Filed: Nov. 27, 2020

(86) PCT No.: PCT/JP2020/044300
§ 371 (c)(1),
(2) Date: Jun. 10, 2022

(87) PCT Pub. No.: WO2021/117512
PCT Pub. Date: Jun. 17, 2021

(65) Prior Publication Data
US 2023/0060086 A1 Feb. 23, 2023

(30) Foreign Application Priority Data
Dec. 13, 2019 (JP) ................. 2019-225284

(51) Int. Cl.
*H02M 7/539* (2006.01)
*G01R 19/32* (2006.01)
(Continued)

(52) U.S. Cl.
CPC .......... *H02M 7/5395* (2013.01); *G01R 19/32* (2013.01); *H02M 1/0009* (2021.05);
(Continued)

(58) Field of Classification Search
CPC ............. H02M 7/5395; H02M 1/0009; H02M 1/0048; H02M 1/327; H02M 7/53871; G01R 19/32; H03K 17/687
See application file for complete search history.

(56) References Cited

U.S. PATENT DOCUMENTS 6,016,042 A * 1/2000 Miura ................ H02P 7/04
318/434
7,129,660 B2 * 10/2006 Fujita .................. H02P 21/16
318/434
(Continued)

FOREIGN PATENT DOCUMENTS

JP  2004-117111 A  4/2004
JP  2006-271098 A  10/2006
(Continued)

OTHER PUBLICATIONS

International Search Report, PCT/JP2020/044300, Dec. 22, 2020, 2 pgs.
(Continued)

*Primary Examiner* — Yusef A Ahmed
(74) *Attorney, Agent, or Firm* — Volpe Koenig

(57) ABSTRACT

A power conversion apparatus accurately estimates a main current of a power device using observation of a sense current. The power conversion apparatus includes: an inverter circuit including a device having a main element and a sense element; a temporary-main-current estimator estimates a current flowing through the main element, from a sense current flowing through the sense element, as a temporary main current; a temperature-difference estimator configured to estimate a temperature difference between the main element and the sense element based on a gate drive signal for the main element and the temporary main current; a main-current corrector corrects the temporary main current using the estimated temperature difference and a tempera- (Continued)

ture characteristic of on-resistance of the main element and output the corrected temporary main current as a corrected main current; and an inverter control circuit configured to output the gate drive signal based on the corrected main current.

17 Claims, 10 Drawing Sheets

(51) Int. Cl.
  *H02M 1/00* (2006.01)
  *H02M 1/32* (2007.01)
  *H02M 7/5387* (2007.01)
  *H02M 7/5395* (2006.01)
  *H03K 17/687* (2006.01)
(52) U.S. Cl.
  CPC ......... *H02M 1/0048* (2021.05); *H02M 1/327* (2021.05); *H02M 7/53871* (2013.01); *H03K 17/687* (2013.01)

(56) References Cited

U.S. PATENT DOCUMENTS

| | | | |
|---|---|---|---|
| 9,762,117 B2* | 9/2017 | Sasaki | H02M 1/088 |
| 2006/0033459 A1* | 2/2006 | Peter | G01R 19/0092 |
| | | | 318/400.27 |
| 2006/0215341 A1* | 9/2006 | Sakurai | H03K 17/0828 |
| | | | 361/100 |
| 2009/0046405 A1* | 2/2009 | Ichikawa | H03K 17/0822 |
| | | | 361/103 |
| 2011/0309776 A1* | 12/2011 | Miyamoto | H02P 27/06 |
| | | | 318/139 |
| 2012/0099618 A1* | 4/2012 | Nishi | G01K 7/42 |
| | | | 374/152 |
| 2012/0217795 A1* | 8/2012 | Hasegawa | H02M 7/48 |
| | | | 307/9.1 |
| 2013/0153900 A1* | 6/2013 | Kinouchi | H01L 29/66068 |
| | | | 257/48 |
| 2013/0162053 A1* | 6/2013 | Iizuka | H01H 47/00 |
| | | | 307/140 |
| 2013/0257517 A1* | 10/2013 | Kawashima | G01R 19/32 |
| | | | 327/513 |
| 2015/0121874 A1* | 5/2015 | Yoshida | F01K 13/02 |
| | | | 60/660 |
| 2015/0160074 A1* | 6/2015 | Tanabe | G01K 7/42 |
| | | | 374/185 |
| 2015/0207429 A1* | 7/2015 | Akiyama | H01L 24/49 |
| | | | 363/131 |
| 2015/0381101 A1* | 12/2015 | Odaka | H02P 29/68 |
| | | | 318/472 |
| 2016/0308524 A1* | 10/2016 | Inoue | H03K 17/168 |
| 2017/0001661 A1* | 1/2017 | Nakamura | H02P 29/60 |
| 2017/0288593 A1* | 10/2017 | Suzuki | B60L 3/003 |
| 2017/0358512 A1* | 12/2017 | Kakimoto | H01L 21/822 |
| 2018/0254734 A1* | 9/2018 | Kano | B62D 5/0496 |
| 2019/0199195 A1* | 6/2019 | Akiyama | H02P 29/68 |
| 2019/0372567 A1* | 12/2019 | Yoshida | H03K 17/0828 |
| 2020/0412277 A1* | 12/2020 | Natsuhara | H02M 7/53875 |
| 2021/0184557 A1* | 6/2021 | Nishibata | H02M 1/32 |
| 2022/0034949 A1* | 2/2022 | Inomata | G01R 21/14 |
| 2022/0115974 A1* | 4/2022 | Kobayashi | F25B 31/026 |
| 2022/0221494 A1* | 7/2022 | Lee | H02M 7/5395 |
| 2022/0321029 A1* | 10/2022 | Yano | H02M 1/08 |
| 2022/0385208 A1* | 12/2022 | Matsuoka | G01R 31/26 |
| 2023/0059002 A1* | 2/2023 | Suzuki | H03K 17/14 |
| 2023/0223867 A1* | 7/2023 | Wada | H02M 1/0009 |
| | | | 363/97 |
| 2023/0327577 A1* | 10/2023 | Saito | H02M 7/53871 |
| | | | 363/95 |
| 2023/0396198 A1* | 12/2023 | Shinohara | H02P 21/16 |

FOREIGN PATENT DOCUMENTS

| | | |
|---|---|---|
| JP | 2016-077110 A | 5/2016 |
| WO | 2012/029652 A1 | 3/2012 |

OTHER PUBLICATIONS

Extended European Search Report issued on Nov. 20, 2023 for European Patent Application No. 20898135.7.

* cited by examiner

POWER CONVERSION APPARATUS

TECHNICAL FIELD

The present invention relates to a power conversion apparatus including a power device, and particularly relates to a power conversion apparatus that requires highly accurate current measurement.

BACKGROUND ART

As next-generation automobiles, hybrid vehicles in which a combination of an internal combustion engine and an electric motor rotates driving wheels and electric vehicles in which only an electric motor rotates driving wheels have been attracting attention. As an automobile motor used in such vehicles as cited above, a compact and high-torque synchronous motor in which a permanent magnet is embedded in a rotor is adopted. Then, to produce the highest possible torque of the synchronous motor, vector control is used in general.

In such vector control, a current command is calculated from a torque command generated by an accelerator command or a brake command, and a speed. In response to the current command, a PWM signal is generated to drive a power device of an inverter. The vector control requires a current sensor for measuring an output current of the inverter. For this reason, a sense element exclusively used for current detection is provided in addition to a main control element such as an IGBT or a MOSFET forming the power device. A current (sense current) flowing through the sense element is detected, whereby a main current flowing through the main control element is estimated. Such a power conversion circuit is disclosed in PTL 1, for example.

Such a power device including a sense element and a main control element as described above has temperature dependence. This causes a problem of incapability of achieving accurate current measurement due to variation in a sense-current characteristic with a temperature. In view of this, according to PTL 1, a temperature detection diode is formed in a semiconductor substrate forming a power device, and a current characteristic is corrected by the temperature detection diode.

CITATION LIST

Patent Literature

PTL 1: JP 2006-271098 A

SUMMARY OF INVENTION

Technical Problem

Meanwhile, in a case where the temperature of a power device is measured using a temperature sensitive element such as the above-described temperature detection diode, only the temperature of a position where the temperature sensitive element is present in the power device can be measured. In some cases, a power device is formed of a semiconductor chip having a large area exceeding one mm square, and the power device itself serves as a heating element during operation. Thus, the temperature inside the chip is not uniform, and the central portion and the end in the chip have a temperature difference. In most cases, the temperature of the central portion of a chip where heat is more likely to be accumulated is higher than the temperature of the end of the chip. Of the two portions, the end of a chip is suitable as a position where a temperature sensitive element is placed. The reasons are as follows. A power device, in which both surfaces of a chip serve as drain or source terminals for the purpose of improving low on-resistance and coolability, is fitted between metals serving as both of an electrode and a heat sink. Thus, in the central portion of the chip, a pad that is used for a temperature sensitive element and can be connected to a bonding wire cannot be placed. Alternatively, in a case where a temperature sensitive element alone is placed in the central portion, away from a pad, and the temperature sensitive element and the pad placed in the end of a chip are connected by wires, the wired portion is an inactive area that does not function as a power device. This reduces the area efficiency to increase the cost. The same applies to a sense element, and it can be said that it is necessary to place the sense element, as well as a temperature sensitive element, in the end of a chip in order to achieve low on-resistance, low thermal resistance, and low cost for a power device.

Specifically, in measurement of the temperature of a chip using a temperature sensitive element, an example of which is described in the above-cited PTL 1, a measured temperature is the temperature of the end of the chip, in other words, the temperature of only a sense element. The temperature of a main control element (hereinafter referred to as a main element) cannot be measured, and is different from the temperature of the sense element. In the meantime, a power device such as an IGBT and a MOSFET is a semiconductor, and thus its on-resistance has temperature dependence. Because of parallel connection of the main element and the sense element, variation in temperature difference between the main element and the sense element causes variation in a ratio (sense ratio) between a main current (hereinafter referred to as a main current) and a sense current. That is, in a case where a temperature difference between a main element and a sense element is not taken into consideration as in PTL 1, an error occurs in estimation of the main current, causing a problem of reduced accuracy.

An object of the present invention is to provide a power conversion apparatus that can accurately estimate a main current using observation of a sense current by estimating the main current in consideration of a temperature difference, for a power device including a sense element.

Solution to Problem

To attain the above-described object, the present invention provides a power conversion apparatus that includes: an inverter circuit including a device having a main element and a sense element; a temporary-main-current estimator configured to estimate a current flowing through the main element, from a sense current flowing through the sense element, as a temporary main current; a temperature-difference estimator configured to estimate a temperature difference between the main element and the sense element based on a gate drive signal for the main element and the temporary main current; a main-current corrector configured to correct the temporary main current using the estimated temperature difference and a temperature characteristic of on-resistance of the main element and output the corrected temporary main current as a corrected main current; and an inverter control circuit configured to output the gate drive signal based on the corrected main current.

Advantageous Effects of Invention

According to the present invention, in a device having a sense element mounted thereon, a main current flowing through the device can be accurately estimated using a chip temperature detected in the end of a chip, and a sense current.

DESCRIPTION OF EMBODIMENTS

Hereinafter, embodiments of the present invention will be described in detail with reference to the drawings. However, the present invention is not limited to the following embodiments, and examples of various modifications and applications are also included in the technical concept of the present invention.

First, a power conversion apparatus to which various embodiments of the present invention are applied will be described with reference to the drawings. While a power conversion apparatus according to each embodiment can be typically applied to a hybrid vehicle or an electric vehicle, the following description will be made about a case where the power conversion apparatus is applied to a hybrid vehicle as one example. However, it is a matter of course that the power conversion apparatus of each embodiment can be used not only for a hybrid vehicle and an electric vehicle, but also as a power conversion apparatus of an electric motor used for other industrial equipment.

Figure 1:
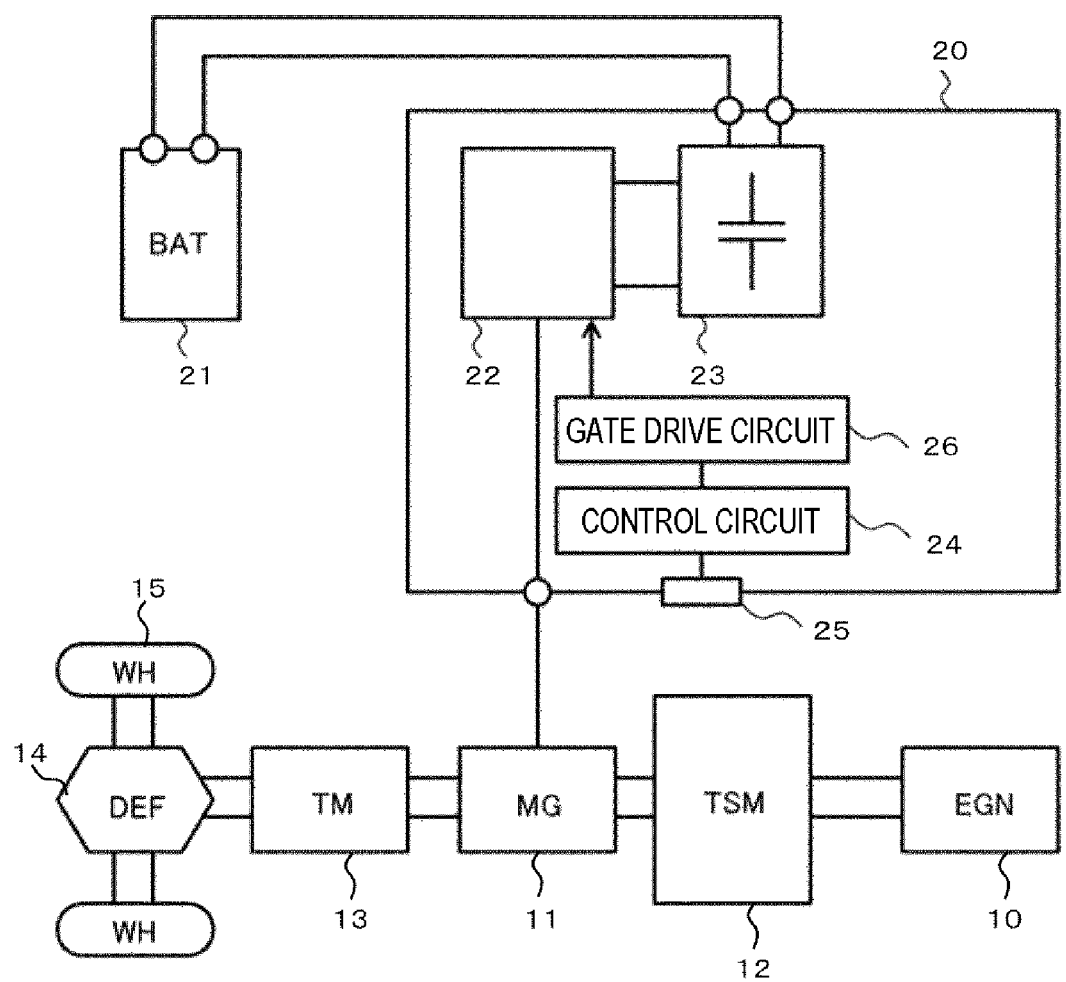
FIG. 1 is a view illustrating an example of a system configuration of a hybrid vehicle.

FIG. 1 illustrates an example of a system configuration of a hybrid vehicle. An internal combustion engine 10 and a motor generator 11 are power sources that generate traveling torque of the vehicle. Further, the motor generator 11 not only generates rotary torque as an electric motor, but also has a power generating function of converting rotary force that is mechanical energy applied to the motor generator 11, into electric power.

As described above, the motor generator 11 operates as not only an electric motor but also a power generator depending on a method of driving the vehicle.

An output of the internal combustion engine 10 is transmitted to the motor generator 11 via a power distribution mechanism 12, and rotary torque from the power distribution mechanism 12 or rotary torque generated by the motor generator 11 is transmitted to wheels 15 via a transmission 13 and a differential gear 14.

On the other hand, during a regenerative braking operation, rotary torque is transmitted from the wheels 15 to the motor generator 11, and the motor generator 11 generates AC power based on the transmitted rotary torque. The generated AC power is converted into DC power by a power conversion apparatus 20. The DC power is charged into a high-voltage battery 21, and the charged power is used again as travelling energy.

The power conversion apparatus 20 includes an inverter circuit 22 and a smoothing capacitor 23. The inverter circuit 22 is electrically connected to the battery 21 via the smoothing capacitor 23, and power is transmitted between the battery 21 and the inverter circuit 22. The smoothing capacitor 23 smooths DC power supplied to the inverter circuit 22.

A control circuit 24 for the inverter circuit 22 of the power conversion apparatus 20 receives a command from a host control device via a connector 25 for communication or transmits data indicating an operating state to the host control device. The control circuit 24 calculates a controlled quantity of the motor generator 11 in response to a command as input, generates a control signal based on a result of the calculation, and supplies the control signal to a gate drive circuit 26. In response to the control signal, the gate drive circuit 26 generates a drive signal for controlling the inverter circuit 22.

In a case where the motor generator 11 is caused to operate as an electric motor, the inverter circuit 22 generates AC power based on DC power supplied from the battery 21 and supplies the AC power to the motor generator 11. The motor generator 11 and the inverter circuit 22 form a drive mechanism that operates as a motor-generator unit.

Figure 2:
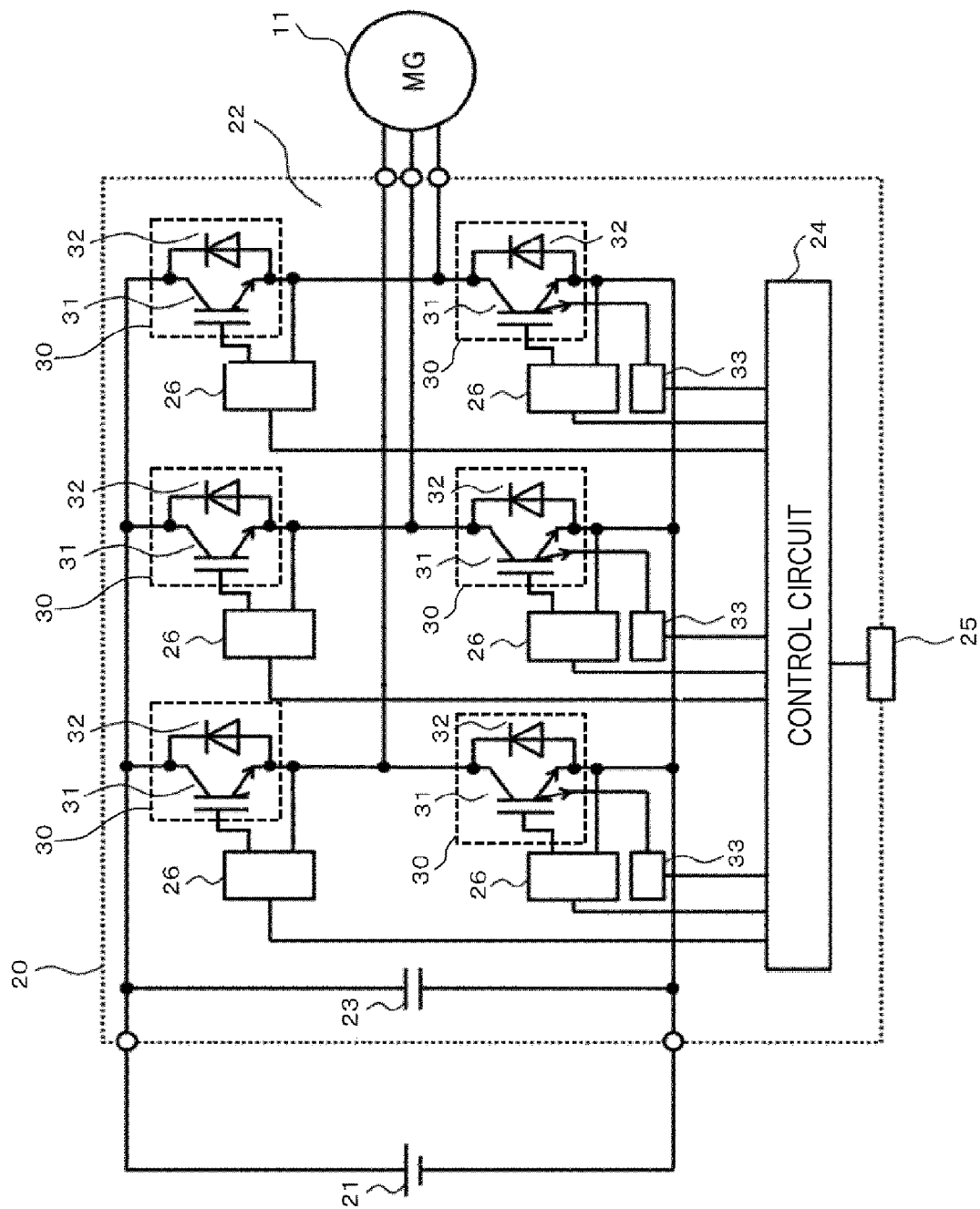
FIG. 2 is a view illustrating an example of a circuit configuration of a power conversion apparatus in the system of FIG. 1.

FIG. 2 is a view illustrating a circuit configuration of the power conversion apparatus 20 in the system. The following description will be made about an example of a power device using a MOSFET. The power conversion apparatus 20 includes upper arms and lower arms each including a control MOSFET 31 forming a power device 30 and a diode 32, for three phases of U phase, V phase, and W phase of AC power.

These three-phase upper and lower arms form the inverter circuit 22. Meanwhile, the control MOSFET 31 will be referred to as a "main control element" in relation to a sense element, where appropriate.

A drain terminal of the upper-arm control MOSFET 31 is electrically connected to a positive-electrode-side capacitor terminal of the smoothing capacitor 23, and a source terminal of the lower-arm MOSFET 31 is electrically connected to a negative-electrode-side capacitor terminal of the smoothing capacitor 23. Thus, the control MOSFET 31 includes a drain terminal, a source terminal, and a gate terminal. Further, the diode 32 is electrically connected in parallel between the drain terminal and the source terminal.

The gate drive circuit 26 is provided between the source terminal and the gate terminal of the control MOSFET 31, and controls turn-on and turn-off of the control MOSFET 31. The control circuit 24 for the inverter circuit supplies a control signal to the plurality of gate drive circuits 26.

The lower-arm power device 30 is provided with a sense element for current detection arranged in parallel with the control MOSFET 31. Also the sense element is formed of a MOSFET, and a sense current flowing through its source terminal is input to a current detection circuit 33. Then, the speed of a rotor and the position of a magnetic pole are calculated based on a current detected by the current detection circuit 33 and a voltage measured separately from the current. By using the calculated values, the rotary torque and the rotational speed are controlled.

As described above, the control circuit 24 for the inverter circuit 22 receives a control command from the host control device, generates a control signal for controlling the power devices 30 forming the upper arms and the lower arms of the inverter circuit 22 in response to the control command, and supplies the control signal to the gate drive circuits 26. In response to the control signal, the gate drive circuits 26 supply drive signals for driving the power devices 30 forming the upper and lower arms of each phase, to the power devices 30 of each phase.

The control MOSFET 31 of the power device 30 is turned on or off in response to the drive signal from the gate drive circuit 26, to convert DC power supplied from the battery 21 into three-phase AC power. The AC power is supplied to the motor generator 11. Such a power conversion apparatus as having the above-described configuration is already well known.

Figure 3A:
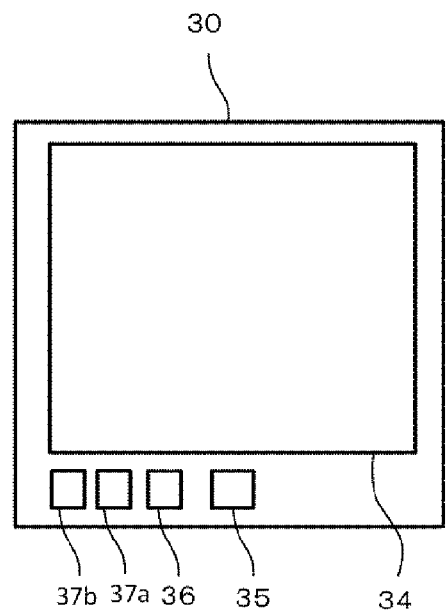
FIGS. 3A to 3B includes views illustrating a configuration of a power device used in the power conversion apparatus of each embodiment.
Figure 3B:
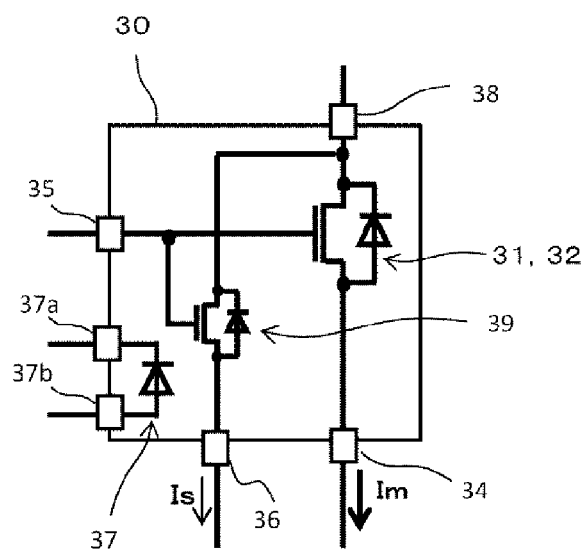

Meanwhile, as illustrated in a view of FIG. 3A, the power device 30 is a semiconductor chip having a large area, and includes a temperature sensitive element 37 and a sense element 39 in an end of the chip as illustrated in a view of FIG. 3B. The temperature sensitive element 37 is connected to the outside of the chip via a pad 37a and a pad 37b, and the sense element 39 has its source terminal connected to the outside via a pad 36. Further, the gate is connected to the gate drive circuit 26 via a pad 35. The source terminal of the main element is a pad 34, and the drain terminal common to the main element and the sense element is connected via a pad 38 on the back surface of the chip.

Figure 4:
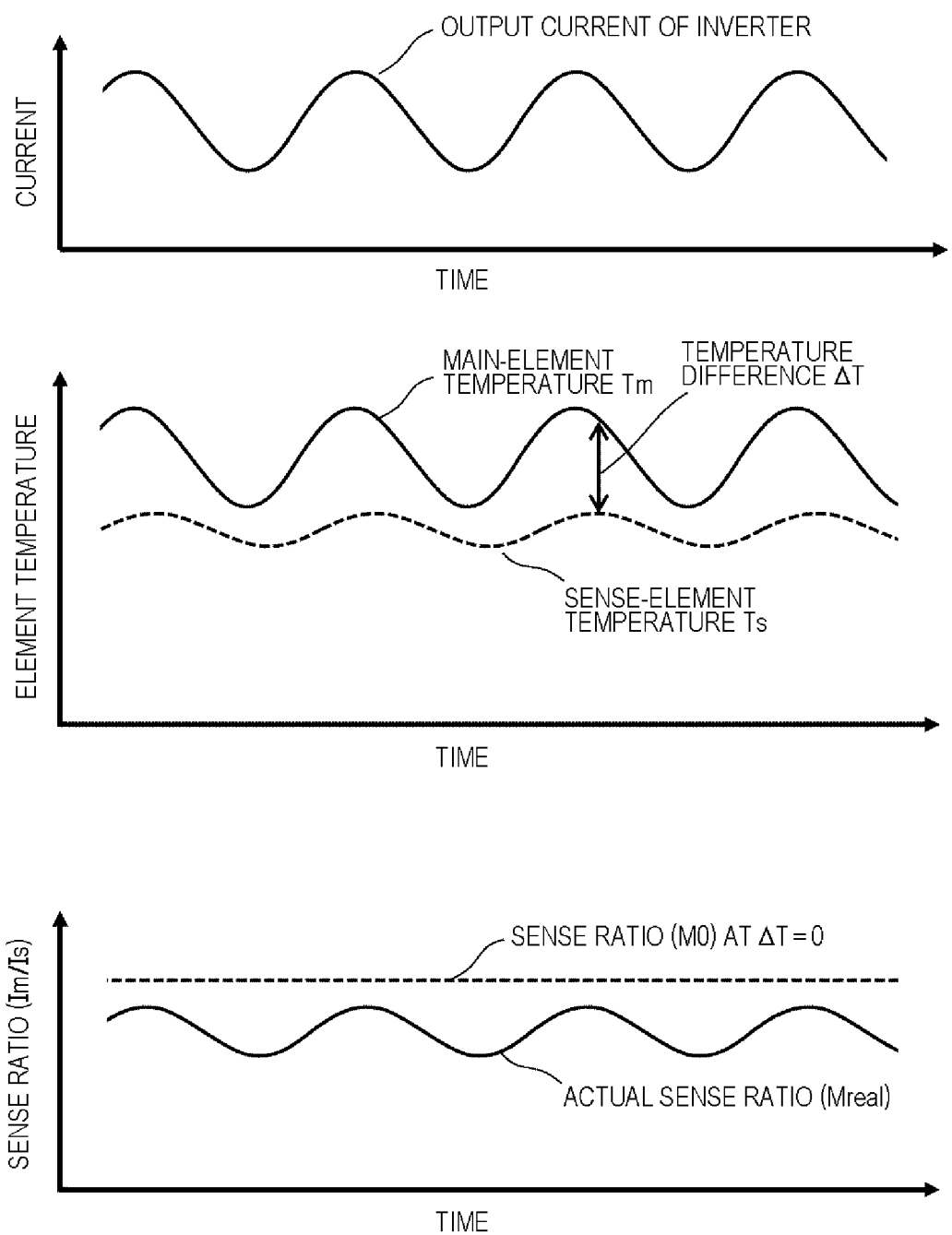
FIG. 4 is a characteristic chart indicating an example of variation with time in a main-element temperature, a sense-element temperature, and a sense ratio.

In this regard, in a case where the inverter circuit 22 outputs a sinusoidal current as illustrated in the upper part of FIG. 4, when the power device 30 is caused to perform switching and a current flows, a power loss occurs in synchronization with an output current in the power device 30. Then, the power device 30 generates heat, and a main-element temperature Tm varies in synchronization with the output current as indicated by a solid line in the middle part of FIG. 4. On the other hand, the sense element in the end of the chip has high coolability and heat in the central portion of the chip is transmitted thereto with a delay. Thus, as illustrated by a broken line in the middle part of FIG. 4, a sense-element temperature Ts has an amplitude smaller than that of Tm and varies with a delay behind Tm. In other words, a temperature difference ΔT between the main element and the sense element varies with time. Further, ΔT has different values depending on the frequency and amplitude of an output current of the inverter.

Figure 5:
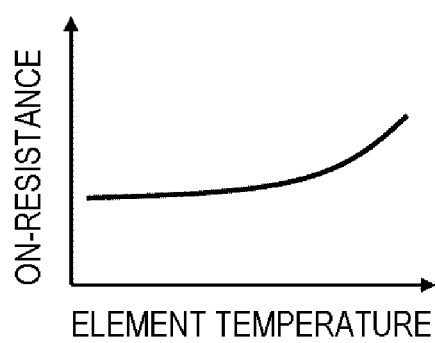
FIG. 5 is a characteristic chart indicating a typical temperature characteristic of on-resistance of the power device.

The influence of the temperature difference ΔT on the accuracy of current estimation will be described. First, suppose that T is an element temperature, Rs(T) is the on-resistance of the sense element, and Rm(T) is the on-resistance of the main element. In a case where the power device is a SiC-MOSFETd, the on-resistance of each element typically has a characteristic of increasing with temperature rise as illustrated in FIG. 5.

A sense ratio M can be described as the following Expression (1).

[Expression 1]

$$M = \frac{R_S(T_S)}{R_M(T_m)} \quad (1)$$

The relationship between Ts and Tm is as expressed by the following Expression (2) using ΔT.

[Expression 2]

$$T_M = T_S + \Delta T \quad (2)$$

In this regard, information about the sense ratio that is prepared in advance for estimating the main current from the sense current is a sense ratio at a certain fixed temperature difference ΔT0. For example, in a case where the temperature characteristic of the sense ratio is pre-acquired using a thermostatic tank, the sense element and the main element are externally heated to a uniform temperature, so that ΔT0 is equal to zero. Then, with the sense ratio at that time being represented as M0(T), the following Expression (3) is given.

[Expression 3]

$$M_0(T_S) = \frac{R_S(T_S)}{R_M(T_S + \Delta T_0)} \quad (3)$$

On the other hand, while the device is operating and generating heat, a sense ratio Mreal is as expressed by the following Expression (4).

[Expression 4]

$$M_{real}(T_S) = \frac{R_S(T_S)}{R_M(T_S + \Delta T)} \quad (4)$$

As long as the actual temperature difference ΔT is different from the temperature difference ΔT0 obtained in a case where the sense ratio is pre-acquired, M0(T)≠Mreal(T). Thus, the sense ratio varies more than expected depending on the difference between ΔT and ΔT0, which causes a temperature-difference-induced error in current estimation.

A deviation of the sense ratio caused by ΔT can be expressed as a coefficient K of M0 (T) as in the following Expression (5).

[Expression 5]

$$M_{real}(T_S) = K \cdot M_0(T_S) \quad (5)$$

In Expression (5), K is a coefficient defined by the following Expression (6).

[Expression 6]

$$K = \frac{R_M(T_S + \Delta T_0)}{R_M(T_S + \Delta T)} \quad (6)$$

As indicated by Expression (6), K is the ratio between the on-resistance of the main element at a temperature of Ts+ΔT0 and the on-resistance at a temperature of Ts+ΔT. Specifically, when the temperature characteristic Rm (T) of the on-resistance of the main element, the temperature difference ΔT0 between the main element and the sense element obtained in a case where the sense ratio is pre-acquired, and the temperature difference ΔT during the actual operation are known, K can be obtained. As a result, a correct value of the sense ratio Mreal can be acquired, so that the main current can be estimated with high accuracy.

In this regard, it is possible to make Rm(T) known by pre-acquiring the characteristic, and it is also possible to make $\Delta T0$ equal to zero by placing the device in a constant-temperature state at the time of pre-acquiring the sense ratio. As can be seen therefrom, only by knowing $\Delta T$ that varies with time depending on the operating state of the power device in real time, it is possible to derive the coefficient K, thereby acquiring the correct sense ratio Mreal in real time. That is, the sense ratio is corrected using the pre-stored temperature characteristic of the on-resistance of the power device, and the main current can be accurately estimated from the sense current.

First Embodiment

A first embodiment is an embodiment of a power conversion apparatus that derives the above-described coefficient K and corrects an estimated current value using the coefficient K. Specifically, the first embodiment is an embodiment of a power conversion apparatus that includes: an inverter circuit including a device having a main element and a sense element; a temporary-main-current estimator configured to estimate a current flowing through the main element, from a sense current flowing through the sense element, as a temporary main current; a temperature-difference estimator configured to estimate a temperature difference between the main element and the sense element based on a gate drive signal for the main element and the temporary main current; a main-current corrector configured to correct the temporary main current using the estimated temperature difference and a temperature characteristic of on-resistance of the main element and output the corrected temporary main current as a corrected main current; and an inverter control circuit configured to output the gate drive signal based on the corrected main current.

Figure 6:
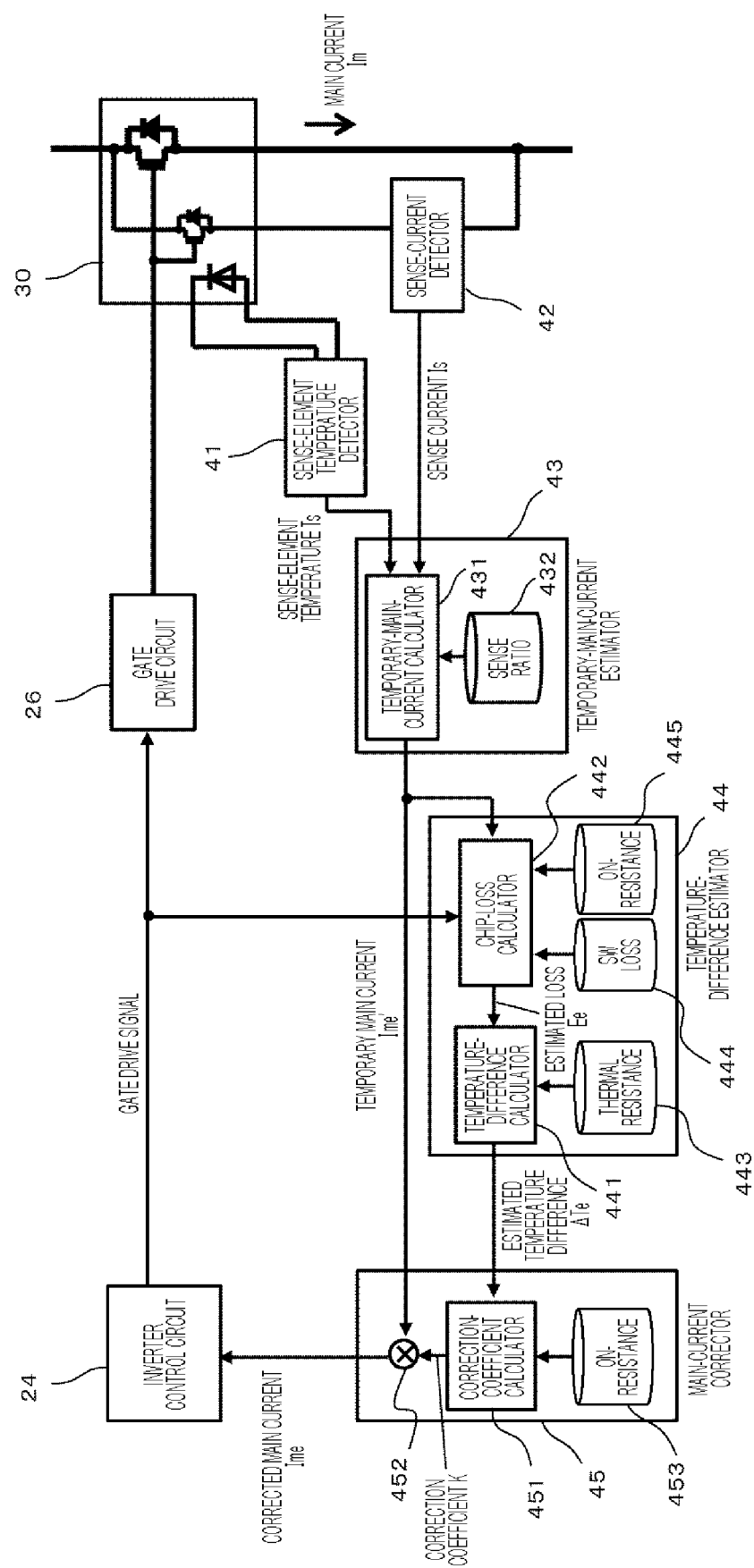
FIG. 6 is a view illustrating a configuration example of a power conversion apparatus according to a first embodiment.

In the power conversion apparatus according to the present embodiment, a sense current of the power device 30 is detected by a sense-current detector 42 as illustrated in FIG. 6. A temporary-main-current estimator 43 acquires a temporary main current value Ime' including a temperature-difference-induced error described above, from the detected sense current Is. Then, a temperature-difference estimator 44 calculates an estimated value $\Delta Te$ of a temperature difference between the main element and the sense element by using the temporary main current and a gate drive signal. Finally, a main-current corrector 45 calculates a correction coefficient from the estimated temperature difference $\Delta Te$ and the temperature characteristic of the on-resistance, acquires the main current Ime in which the temperature-difference-induced error has been corrected by the correction coefficient, and inputs the corrected main current Ime to the inverter control circuit 24 to perform real-time control of the inverter circuit. Hereinafter, the temporary-main-current estimator 43, the temperature-difference estimator 44, and the main-current corrector 45 will be sequentially described.

The temporary-main-current estimator 43 includes a memory 432 in which the pre-acquired sense ratio M0 is stored. A temporary-main-current calculator 431 performs multiplication of the following Expression (7) for the sense current Is acquired by the sense-current detector 42.

[Expression 7]

$$I_{ME}' = M_0 I_S \quad (7)$$

Then, the temporary-main-current calculator 431 outputs a temporary main current Ime'. In other words, the temporary-main-current estimator 43 estimates the temporary main current Ime' based on the sense ratio that is the pre-acquired ratio between the main current and the sense current, and the sense current Is.

In this regard, the sense ratio has a temperature characteristic due to non-uniformity of the structure of the power device 30 in some cases. For this reason, the sense ratio stored in the memory 432 may be in the form of a table having temperature dependence. In this case, the temporary-main-current estimator 43 may perform temperature correction using the sense-element temperature Ts acquired by a sense-element temperature detector 41. Alternatively, in the same manner as in the above-described case, the sense ratio has current dependence in some cases. In this case, the sense ratio may be in the form of a table having dependence on a sense current. In either case, the power device 30 includes a temperature sensitive element, and the temporary-main-current estimator 43 can perform temperature correction of a temporary main current based on the sense-element temperature Ts detected by the sense-element temperature detector 41 in response to an output of the temperature sensitive element.

The temperature-difference estimator 44 has a role of estimating the temperature difference $\Delta T$ between the main element and the sense element, and includes a chip-loss calculator 442 that calculates an estimated loss Ee based on the temporary main current Ime', and a temperature-difference calculator 441 that calculates an estimated temperature difference based on the estimated loss. The temperature difference $\Delta T$ is a temperature difference inside the chip, and it is not easy to acquire the temperature of the central portion of the chip as described above. Thus, the temperature difference $\Delta T$ is acquired by estimation based on the operation state of the power device 30. Specifically, the temperature-difference estimator 44 estimates a loss generated in the power device 30, and calculates $\Delta T$ in real time from a pre-acquired loss, using thermal resistance to the temperature difference.

First, an example of a configuration for loss estimation of the power device 30 will be described. A loss of the power device 30 includes a conduction loss caused by flow of the main current through the main element having on-resistance and a switching loss generated at each PWM switching instant during a power conversion operation. A loss Eloss in one PWM cycle is expressed by the following Expression (8), where D is a duty ratio of PWM, FPWM is a PWM frequency, Eon is a turn-on loss, and Eoff is a turn-off loss.

[Expression 8]

$$E_{LOSS} = \frac{D}{F_{PWM}} I_M^2 R_M + E_{on} + E_{off} \quad (8)$$

The first term represents a conduction loss and the second and third terms represent a switching loss. The chip-loss calculator 442 calculates a loss according to Expression (8) and outputs an estimated loss Ee at each PWM switching instant. The duty ratio and the frequency of PWM that are required for calculation of the conduction loss can be acquired by monitoring of a gate drive signal output by the inverter control circuit 24. The duty ratio and the frequency are not necessarily required to be acquired from the gate drive signal, and may be separately acquired in the form of data from inverter control. Further, as the main current IM, the estimated temporary main current value Ime' having already been acquired can be approximately used. With regard to the on-resistance Rm of the main element, one having been acquired in advance is stored a memory 445 and is used for calculation of the conduction loss. With regard to the switching loss, it is general that the switching loss is proportional to the main current value, and thus, Eon+Eoff having been acquired in advance is stored in a memory 444 in the form of a table with respect to the main current. In some cases, the on-resistance, the turn-on loss, and the turn-off loss have temperature dependence. In such a case, the chip-loss calculator 442 may perform temperature correction using the sense-element temperature Ts detected by the sense-element temperature detector 41. In this case, data about the temperature dependence of the on-resistance, the turn-on loss, and the turn-off loss may be stored in the memory 445 and the memory 444.

Secondly, an example of a configuration for estimation of the temperature difference $\Delta T$ using the estimated loss Ee will be described. $\Delta T$ is calculated and estimated using the estimated loss Ee and the pre-acquired thermal resistance. The power device 30 becomes a heating element due to a loss caused by current conduction during operation, and has a thermal structure that dissipates heat to the outside via a heat sink attached to the power device 30.

Figure 7:
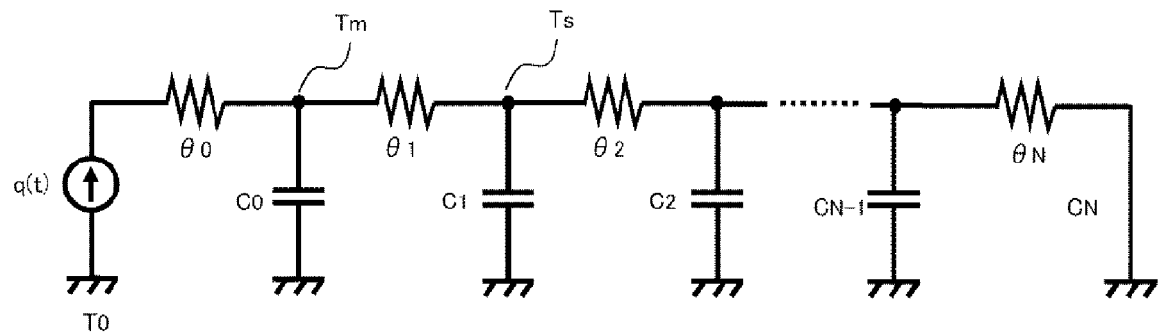
FIG. 7 is a thermal equivalent circuit diagram illustrating a model example of thermal resistance of the power device.

The above-described structure is illustrated in the form of a thermal equivalent circuit in FIG. 7. At the left end of FIG. 7, there is a heat source caused by a loss of the power device 30. A heat flow from the heat source is dissipated to the periphery of the temperature T0 via thermal resistors $\theta 0$ to $\theta N$ and thermal capacitors C0 to CN of the chip and the heat sink. In this thermal equivalent circuit, the time waveform q(t) of the heat flow of the heat source is expressed by the following Expression (9).

[Expression 9]

$$q(t) = F_{PWM} E_{LOSS} \quad (9)$$

Suppose that Zm is impedance of heat transfer from the heat source to the main element and Zs is impedance of heat transfer from the heat source to the sense element. Then, the temperature Tm(s) of the main element and the temperature Ts(s) of the sense element in a frequency domain s are expressed by the following Expressions (10) and (11).

[Expression 10]

$$T_M(s) = Z_M Q(s) + T_0 \quad (10)$$

[Expression 11]

$$T_S(s) = Z_S Q(s) + T_0 \quad (11)$$

In the expressions, Q(s) is q(t) in the frequency domain. The temperature difference $\Delta T$ is as expressed by the following Expression (12).

[Expression 12]

$$\Delta T(s) = (Z_M - Z_S) Q(s) \quad (12)$$

As can be seen therefrom, the time waveform of the temperature difference $\Delta T$ is a result of thermal-impedance (Zm-Zs) filtering of the loss q(t). The temperature-difference estimator 44 passes the estimated loss Ee output at each PWM switching instant through the temperature-difference calculator 441 serving as a discrete-time filter, to acquire the estimated value $\Delta$Te of the temperature difference.

Figure 8:
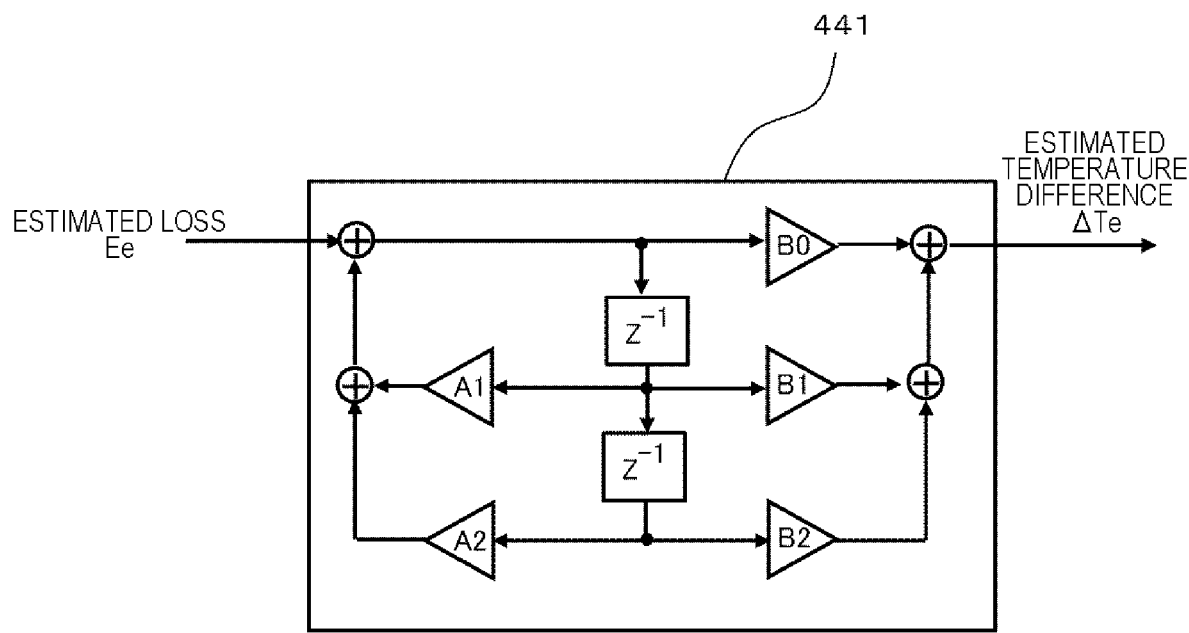
FIG. 8 is a view illustrating a configuration example of a temperature-difference calculator of the power conversion apparatus according to the first embodiment.

In this regard, a real-time $\Delta$Te is required to acquire a corrected main current Ime in real time. This requires a low-delay digital filter as a digital filter forming the temperature-difference calculator. In a case where the digital filter is formed of a FIR filter, a delay of half or more of the number of taps occurs, which is not desirable. A configuration using an IIR filter capable of achieving a low delay as illustrated in FIG. 8 is desirable. Tap coefficients An and Bn (n=1, 2, 3, . . . ) of an IIR filter that achieves the thermal impedance (Zm-Zs) are stored in the memory 443 and used by the temperature-difference estimator 441.

Lastly, a configuration example of the main-current corrector 45 will be described. The main-current corrector 45 includes a correction-coefficient calculator 451 that calculates a correction coefficient based on the estimated temperature difference, and multiplies the temporary main current by the calculated correction coefficient to obtain a corrected main current. The temporary main current Ime' output by the temporary-main-current estimator 43 is already a value corresponding to a result of multiplication of the sense current Is by the sense ratio M0 at the temperature difference $\Delta T$=0. Thus, when Ime' is multiplied by the correction coefficient K, the estimated main current value Ime that should be acquired by multiplication of Is by the sense ratio Mreal that takes into account the temperature difference, is acquired. The correction coefficient K may be calculated according to Expression (6) or may be calculated according to the following Expression (13) that is a first-order approximation thereof.

[Expression 13]

$$K = \frac{\partial R_M}{\partial T} \Delta T \quad (13)$$

The correction-coefficient calculator 451 of the main-current corrector 45 uses the estimated temperature difference $\Delta$Te that is an output of the temperature-difference estimator 44, as $\Delta T$. In a case where the configuration of calculating the correction coefficient K according to Expression (13) is employed, a pre-acquired temperature coefficient of the on-resistance of the main element is stored in a memory 453 and is multiplied by $\Delta$Te in the correction-coefficient calculator 451, thereby acquiring the correction coefficient K. That is, the sense ratio is corrected using the pre-stored temperature characteristic of the on-resistance of the power device, and the main current can be accurately estimated from the sense current. That is, the sense ratio is corrected using the pre-stored temperature characteristic of the on-resistance of the power device, and the main current can be accurately estimated from the sense current. The temporary main current is multiplied by the correction coefficient K obtained by calculation in the main-current corrector 45, so that a corrected main current is acquired, and then is output to the inverter control circuit 24.

As described above, with the power conversion apparatus according to the present embodiment, a main current is estimated in consideration of a temperature difference, which enables accurate current estimation of a power device using observation of a sense current.

Additionally, in a case where the configuration of performing the calculation according to Expression (6) is employed to obtain a more accurate result, it is only required to store the on-resistance of the main element at each of pre-acquired temperatures in the memory 453. However, in this case, the correction-coefficient calculator 451 is required to include a divider. Thus, under a condition where a sufficient hardware scale and a sufficient calculation speed are unavailable, it is desirable to employ the configuration using Expression (13).

Second Embodiment

A second embodiment is an embodiment of a power conversion apparatus including a calculator that corrects a main current at a higher speed than that in the first embodiment. Specifically, the second embodiment is an embodiment of a power conversion apparatus in which a temperature-difference estimator estimates a temperature difference between a main element and a sense element based on an intended driving condition for a device, such as an intended main current value in next switching and a pulse width thereof.

A result of estimation of a main current is used for real-time control of the inverter circuit, and thus calculation of estimating the main current from a sense current needs to be performed with a low delay. In a case where correction calculation is performed many times in order to increase the accuracy as in the present invention, the calculation is very likely to be not in time depending on the operation speed of a calculator. Correction calculation is basically a sum-of-products calculation involving memory access, and one of the most time-consuming calculators is the temperature-difference calculator 441 of the temperature-difference estimator 44. This is because the temperature-difference calculator 441, like the IIR filter illustrated in FIG. 8, is required to perform sum-of-products calculation many times.

Figure 9:
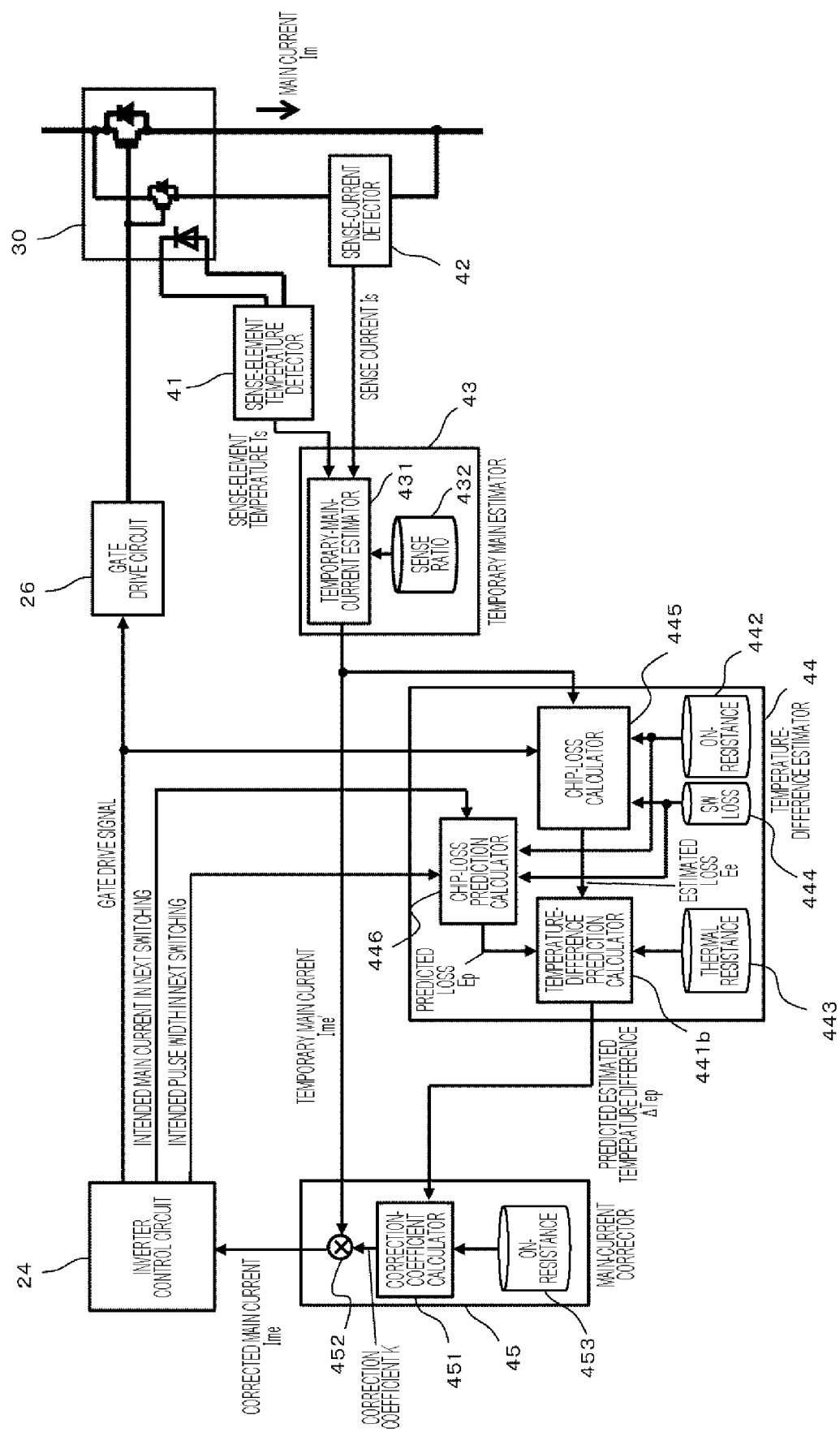
FIG. 9 is a view illustrating a configuration example of a power conversion apparatus according to a second embodiment.

FIG. 9 illustrates a configuration of the power conversion apparatus of the present embodiment in which a chip loss is predicted before it occurs and a temperature difference is calculated in advance in order to reduce a delay in estimation of a temperature difference. In the present embodiment, the inverter control circuit 24 transmits an intended driving condition, specifically, an intended main current value in a next PWM cycle and a pulse width thereof, to the temperature-difference estimator 44. In the inverter control circuit 24, a desired current value and an intended pulse width in next switching are known as an intended driving condition before the gate is driven. Thus, by using these pieces of information, the temperature-difference estimator 44 can predict a loss value of the next switching before it occurs. The temperature-difference estimator 44 illustrated in FIG. 9 includes a chip-loss prediction calculator 446 for this prediction, and has a configuration similar to that of the chip-loss calculator 442 except that it receives an intended main current value in next switching and a pulse width thereof, that is, an intended driving condition. A loss value Ep in the next switching predicted by the chip-loss predictor 446, together with the estimated loss value Ee in the switching having been already performed, is output to a temperature-difference prediction calculator 441b.

Figure 10:
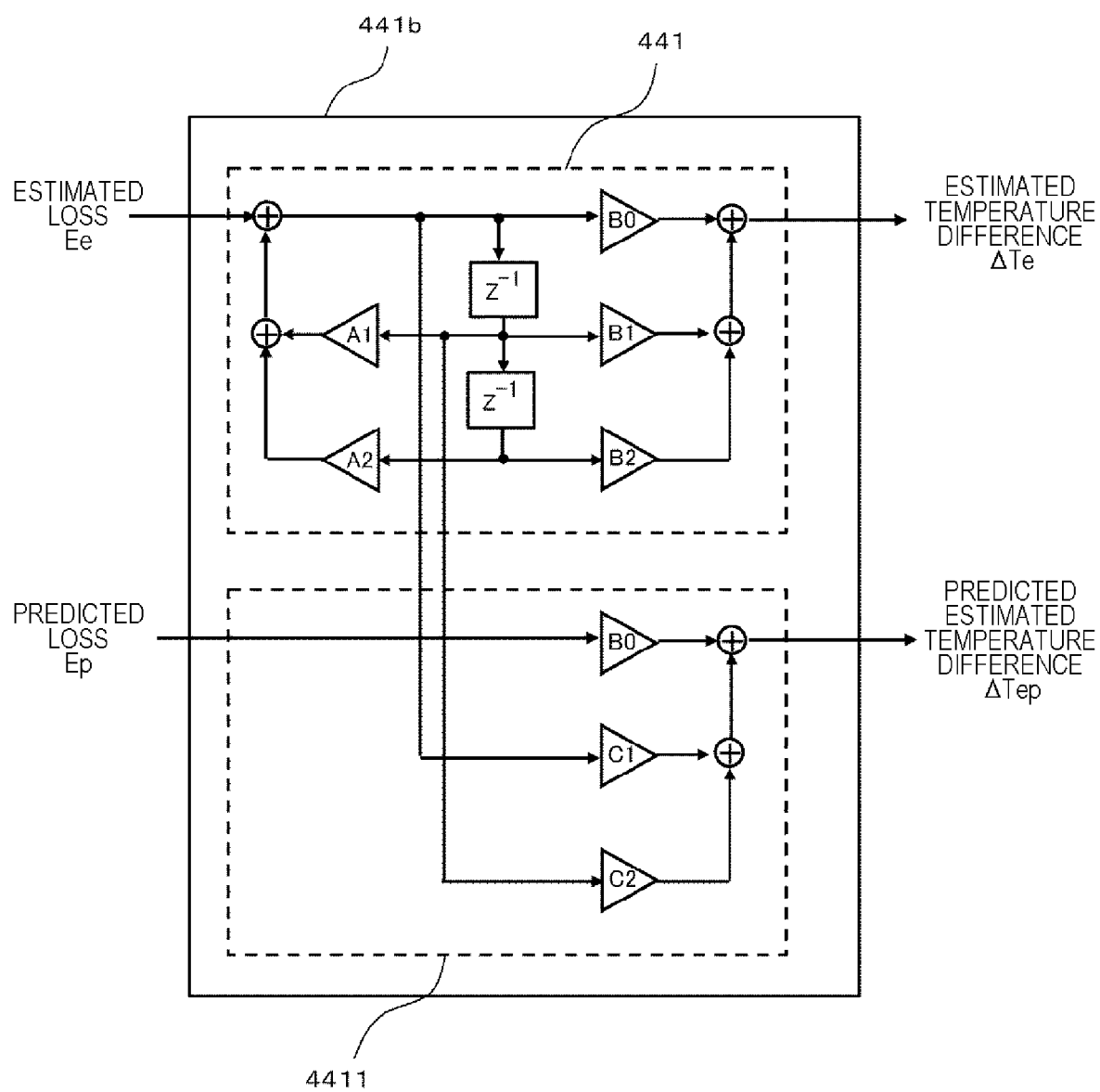
FIG. 10 is a view illustrating a configuration example of a temperature-difference calculator of the power conversion apparatus according to the second embodiment.

FIG. 10 illustrates a configuration example of the temperature-difference prediction calculator 441b. The temperature-difference prediction calculator 441b calculates a predicted value ΔTep of the estimated temperature difference ΔTe in the next switching by using the predicted loss Ep. In the configuration thereof, the temperature-difference calculator 441 in FIG. 8 according to the first embodiment is provided, and further, a second temperature-difference calculator 4411 that performs calculation using an internal state signal and the predicted loss Ep extracted from the calculator 441 is provided. A tap coefficient Cn (n=1, 2, 3, . . . ) conforms to the definition of the following Expression (14).

[Expression 14]

$$C_n = B_n + A_n B_0) \tag{14}$$

With the configuration of the power conversion circuit according to the present embodiment, a temperature difference can be acquired as a predicted value before switching, and after detection of a sense current, the corrected main current Ime can be acquired only with a delay in the temporary-main-current estimator 43 and the main-current corrector 45. This enables low-delay current sensing and can provide a power conversion apparatus including a calculator that can correct a main current at a high speed.

Third Embodiment

A third embodiment is an embodiment of a power conversion apparatus including a calculator that corrects a main current more accurately than the power conversion apparatus in the first embodiment. Specifically, the third embodiment is an embodiment of a power conversion apparatus that includes: a second temperature-difference estimator configured to estimate a temperature difference from the corrected main current; and a second main-current corrector configured to calculate a second correction coefficient based on a second estimated temperature difference estimated by the second temperature-difference estimator and multiply the corrected main current by the second correction coefficient.

In the first embodiment, in the temperature-difference estimator 44, the temporary main current Ime' including an error is used to calculate a chip loss. A conduction loss in a chip loss is proportional to the square of a current. Thus, an error in the temporary main current Ime' with respect to the actual main current Im significantly affects an error in a chip loss. An error in a chip loss causes an error in the estimated temperature difference ΔTe, and finally causes an error in the estimated main current value Ime. Conversely, the more accurate a main current value used in the temperature-difference estimator, the more accurate Ime. Thus, by repeating estimation of a temperature difference and correction of a main current, it is possible to acquire a highly accurate main current.

Figure 11:
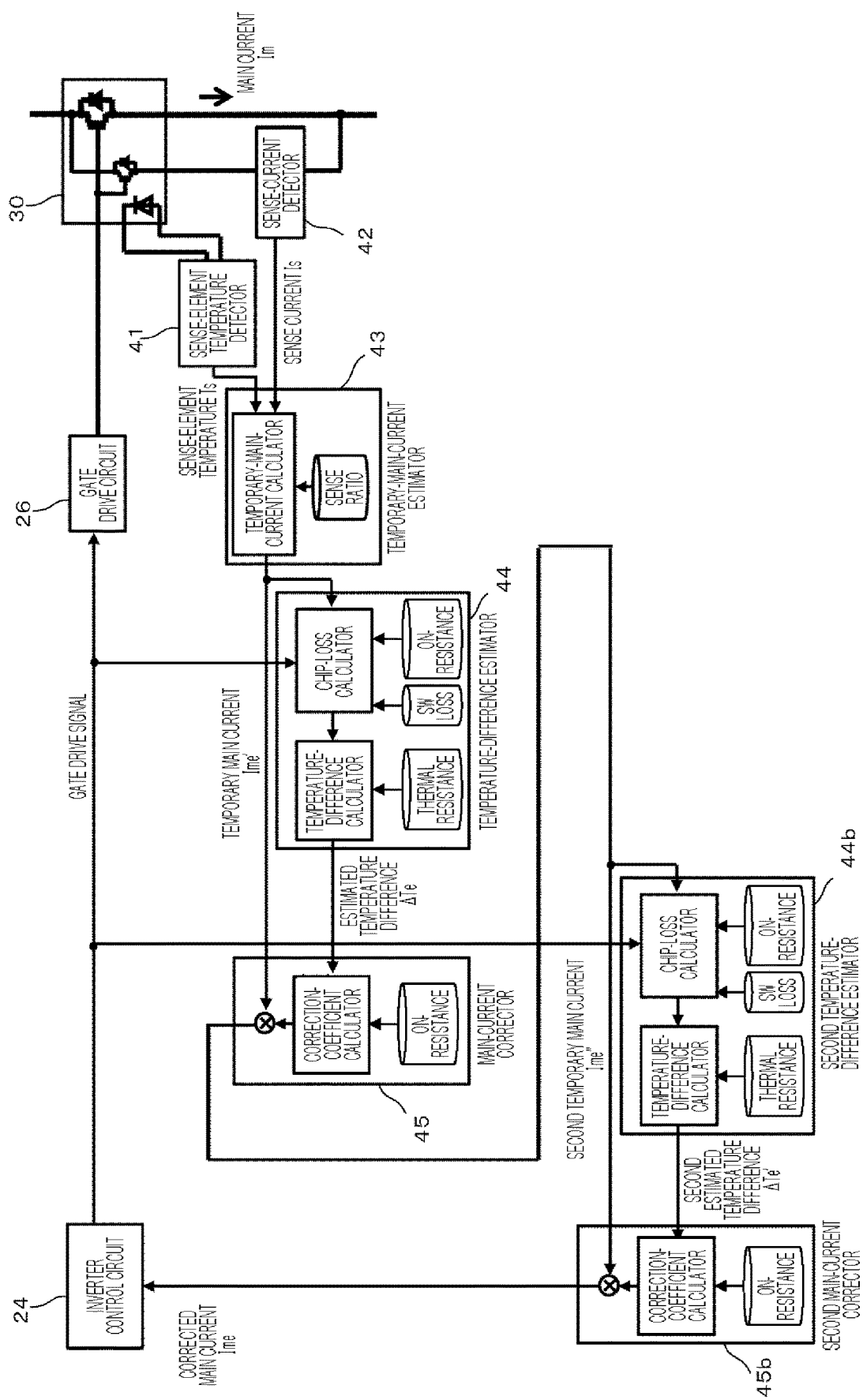
FIG. 11 is a view illustrating a configuration example of a power conversion apparatus according to a third embodiment.

FIG. 11 illustrates a configuration according to the present embodiment in a case where the above-described operation is repeated twice. In the drawing, a second temperature-difference estimator 44b and a second main-current corrector 45b operate upon receipt of an input of a second temporary main current Ime" corresponding to the corrected main current output by the main-current corrector 45. Ime" is more accurate than Ime' by the amount that the influence of a temperature difference is removed. Thus, a second estimated temperature difference ΔTe' output by the second temperature-difference estimator 44b is more accurate than the former estimated temperature difference ΔTe, and the corrected main current Ime output by the second main-current corrector 45b is more accurate than the second temporary main current Ime".

Additionally, though the temperature-difference estimator 44 and the second temperature-difference estimator 44b having the same configuration and the main-current corrector 45 and the second main-current corrector 45b having the same configuration are arranged in series in FIG. 11, this configuration is not necessarily required. By additionally preparing a sequencer, it is also possible to repeatedly use one same temperature-difference estimator and one same main-current corrector, thereby reducing the scales of the memory and the calculator. Further, the number of repetitions is not limited to two, and may be three or more.

In each of the above-described embodiments, the power conversion apparatus that controls the electric motor has been described. However, the present invention can also be applied to other power conversion apparatuses. For example, in a power conversion apparatus including a MOSFET that controls a current flowing through an electromagnetic coil included in an electromagnetic drive mechanism, the present invention can be applied to an overcurrent detection apparatus that detects an overcurrent flowing through the MOSFET to protect the MOSFET. In this regard, examples of the electromagnetic drive mechanism include an electromagnetic flow-rate control valve that regulates a controlled quantity of oil in a continuously variable transmission (CVT) provided in an automobile, a direct-injection fuel injection valve that directly injects fuel into a combustion chamber of an internal combustion engine, and the like.

The present invention is not limited to the above-described embodiments, and includes various modifications. For example, the above-described embodiments have been described in detail for easy understanding of the present invention, and are not necessarily limited to those having all the described components. Further, a part of the components of one embodiment can be replaced with the components of another embodiment, and the components of a certain embodiment can be added to the components of another embodiment. Moreover, a part of the components of each embodiment can be subjected to addition of another component, removal, and replacement with another component.

REFERENCE SIGNS LIST 10 internal combustion engine (EGN)
11 motor generator (MG)
12 power distribution mechanism (TSM)
13 transmission (TM)
14 differential gear (DEF)
15 wheels (WH)
20 power conversion apparatus
21 battery (BAT)
22 inverter circuit
23 smoothing capacitor
24 (inverter) control circuit
25 connector
26 gate drive circuit
30 power device
31 control MOSFET
32 diode
33 current detection circuit
34, 35, 36, 38 pad
37 temperature sensitive element
39 sense element
41 sense-element temperature detector
42 sense-current detector
43 temporary-main-current estimator
431 temporary-main-current calculator
44 temperature-difference estimator
441 temperature-difference calculator
442 chip-loss calculator
446 chip-loss prediction calculator
45 main-current corrector
451 correction-coefficient calculator

The invention claimed is:

1. A power conversion apparatus comprising:
an inverter circuit including a device having a main element and a sense element;
a temporary-main-current estimator configured to estimate a main current flowing through the main element, from a sense current flowing through the sense element, as a temporary main current;
a temperature-difference estimator configured to output an estimated temperature difference between the main element and the sense element based on a gate drive signal for the main element and the temporary main current;
a main-current corrector configured to correct the temporary main current using the estimated temperature difference and a temperature characteristic of on-resistance of the main element and output a corrected temporary main current as a corrected main current; and
an inverter control circuit configured to output the gate drive signal based on the corrected main current,
wherein the temporary-main-current estimator estimates the temporary main current based on a sense ratio that is a pre-acquired ratio between the main current and the sense current, and
wherein the temperature-difference estimator includes a chip-loss calculator that calculates an estimated loss based on the temporary main current, and a temperature-difference calculator that calculates the estimated temperature difference based on the estimated loss.

2. The power conversion apparatus according to claim 1, wherein
the device includes a temperature sensitive element, and
the temporary-main-current estimator corrects a temperature of the temporary main current based on a sense-element temperature detected from an output of the temperature sensitive element.

3. The power conversion apparatus according to claim 1, wherein
the main-current corrector includes a correction-coefficient calculator that calculates a correction coefficient based on the estimated temperature difference.

4. The power conversion apparatus according to claim 3, wherein
the main-current corrector multiplies the temporary main current by the correction coefficient to obtain the corrected main current.

5. The power conversion apparatus according to claim 4, wherein
the main-current corrector multiplies a temperature coefficient of the on-resistance of the main element and the estimated temperature difference at a temperature of the sense element, to obtain the correction coefficient.

6. The power conversion apparatus according to claim 1, wherein
the temperature-difference estimator estimates a temperature difference between the main element and the sense element based on an intended driving condition for the device.

7. The power conversion apparatus according to claim 6, wherein
the intended driving condition includes an intended main current value in next switching and a pulse width of the intended main current value.

8. The power conversion apparatus according to claim 1, further comprising:
a second temperature-difference estimator configured to estimate a temperature difference from the corrected main current; and
a second main-current corrector configured to calculate a second correction coefficient based on a second estimated temperature difference estimated by the second temperature-difference estimator and multiply the corrected main current by the second correction coefficient.

9. A power conversion apparatus comprising:
an inverter circuit including a device having a main element and a sense element;
a temporary-main-current estimator configured to estimate a main current flowing through the main element, from a sense current flowing through the sense element, as a temporary main current;
a temperature-difference estimator configured to output an estimated temperature difference between the main element and the sense element based on a gate drive signal for the main element and the temporary main current;
a main-current corrector configured to correct the temporary main current using the estimated temperature difference and a temperature characteristic of on-resistance of the main element and output a corrected temporary main current as a corrected main current;
an inverter control circuit configured to output the gate drive signal based on the corrected main current,
a second temperature-difference estimator configured to estimate a temperature difference from the corrected main current; and
a second main-current corrector configured to calculate a second correction coefficient based on a second estimated temperature difference estimated by the second temperature-difference estimator and multiply the corrected main current by the second correction coefficient.

10. The power conversion apparatus according to claim 9, wherein
the temporary-main-current estimator estimates the temporary main current based on a sense ratio that is a pre-acquired ratio between the main current and the sense current.

11. The power conversion apparatus according to claim 10, wherein
the device includes a temperature sensitive element, and
the temporary-main-current estimator corrects a temperature of the temporary main current based on a sense-element temperature detected from an output of the temperature sensitive element.

12. The power conversion apparatus according to claim 10, wherein
the temperature-difference estimator includes a chip-loss calculator that calculates an estimated loss based on the temporary main current, and a temperature-difference calculator that calculates the estimated temperature difference based on the estimated loss.

13. The power conversion apparatus according to claim 12, wherein
the main-current corrector includes a correction-coefficient calculator that calculates a correction coefficient based on the estimated temperature difference.

14. The power conversion apparatus according to claim 13, wherein
the main-current corrector multiplies the temporary main current by the correction coefficient to obtain the corrected main current.

15. The power conversion apparatus according to claim 14, wherein
the main-current corrector multiplies a temperature coefficient of the on-resistance of the main element and the estimated temperature difference at a temperature of the sense element, to obtain the correction coefficient.

16. The power conversion apparatus according to claim 9, wherein
the temperature-difference estimator estimates a temperature difference between the main element and the sense element based on an intended driving condition for the device.

17. The power conversion apparatus according to claim 16, wherein
the intended driving condition includes an intended main current value in next switching and a pulse width of the intended main current value.

* * * * *